(12) United States Patent
Yamada et al.

(10) Patent No.: US 11,038,625 B2
(45) Date of Patent: Jun. 15, 2021

(54) BASE STATION APPARATUS, TERMINAL APPARATUS, AND COMMUNICATION METHOD

(71) Applicants: SHARP KABUSHIKI KAISHA, Sakai (JP); FG Innovation Company Limited, Tuen Mun (CN)

(72) Inventors: Ryota Yamada, Sakai (JP); Tomoki Yoshimura, Sakai (JP); Hiroki Takahashi, Sakai (JP)

(73) Assignees: SHARP KABUSHIKI KAISHA, Sakai (JP); FG Innovation Company Limited, Tuen Mun (HK)

( * ) Notice: Subject to any disclaimer, the term of this patent is extended or adjusted under 35 U.S.C. 154(b) by 317 days.

(21) Appl. No.: 16/319,460

(22) PCT Filed: Jun. 28, 2017

(86) PCT No.: PCT/JP2017/023791
§ 371 (c)(1),
(2) Date: Jan. 21, 2019

(87) PCT Pub. No.: WO2018/020942
PCT Pub. Date: Feb. 1, 2018

(65) Prior Publication Data
US 2021/0099250 A1    Apr. 1, 2021

(30) Foreign Application Priority Data

Jul. 28, 2016 (JP) .............................. JP2016-148113

(51) Int. Cl.
*H04L 1/00* (2006.01)
*H03M 13/00* (2006.01)
(Continued)

(52) U.S. Cl.
CPC ....... *H04L 1/0071* (2013.01); *H03M 13/1111* (2013.01); *H03M 13/611* (2013.01); *H04L 1/0057* (2013.01); *H04W 36/0069* (2018.08)

(58) Field of Classification Search
None
See application file for complete search history.

(56) References Cited

U.S. PATENT DOCUMENTS

2008/0168332 A1   7/2008  Palanki et al.
2008/0320353 A1*  12/2008 Blankenship ......... H04L 1/1819
                                                        714/746
(Continued)

FOREIGN PATENT DOCUMENTS

CN   101682486 A   3/2010
CN   101809920 A   8/2010
(Continued)

OTHER PUBLICATIONS

M. Israr and T. Kwasniewski, "Turbo codes—digital IC design," Fifth International Workshop on System-on-Chip for Real-Time Applications (IWSOC'05), Banff, Alberta, Canada, 2005, pp. 341-346, doi: 10.1109/IWSOC.2005.109. (Year: 2005).*

(Continued)

*Primary Examiner* — Daniel F. McMahon
(74) *Attorney, Agent, or Firm* — ScienBiziP, P.C.

(57) ABSTRACT

To improve communication performance such as a throughput and communication efficiency in a system where multiple communication schemes are used. An apparatus includes a transmitter configured to transmit a transmit signal generated from transmission bits, the transmitter including a coding unit configured to generate the transmission bits by coding and rate matching, the coding unit including a first coding unit, a first interleaving unit, a first bit selection unit, a second coding unit, a second interleaving unit, and a second bit selection unit. The first bit selection (Continued)

unit and the second bit selection unit are different in the initial position based on the same redundancy version.

3 Claims, 10 Drawing Sheets

(51) Int. Cl.
*H03M 13/11* (2006.01)
*H04W 36/00* (2009.01)

(56) References Cited

U.S. PATENT DOCUMENTS

| | | | |
|---|---|---|---|
| 2009/0147724 A1* | 6/2009 | Nimbalker | H04L 1/1874 370/315 |
| 2009/0238066 A1 | 9/2009 | Cheng | |
| 2011/0161772 A1 | 6/2011 | Yoshii et al. | |
| 2012/0120927 A1 | 5/2012 | Bucknell | |
| 2014/0304571 A1 | 10/2014 | Kang et al. | |
| 2018/0227077 A1* | 8/2018 | Lee | H03M 13/6306 |
| 2019/0052400 A1* | 2/2019 | Soriaga | H04L 1/1819 |
| 2019/0229861 A1* | 7/2019 | Yoshimura | H04L 1/0043 |
| 2019/0253199 A1* | 8/2019 | Young | H04L 1/1819 |
| 2020/0052858 A1* | 2/2020 | Ma | H04W 72/044 |
| 2020/0212937 A1* | 7/2020 | Li | H03M 13/255 |

FOREIGN PATENT DOCUMENTS

| | | |
|---|---|---|
| CN | 103795505 A | 5/2014 |
| RU | 2427086 C2 | 8/2011 |
| WO | 2009098981 A1 | 8/2009 |
| WO | 2017/131813 A1 | 8/2017 |

OTHER PUBLICATIONS

Jean Dion et al: "A generic and reconfigurable FEC Transceiver for Multi-RAT Platform", ETSI Workshop on Future Radio Technologies—Air Interfaces, Jan. 27-28, 2016, Sophia Antipolis France, XP055379143.
Rate-matching Structure for IEEE 802.16m LDPC Codes, IEEE Draft C802.16M-09/0164, IEEE-SA,Kenichi Kuri et al,Jan. 5, 2009.
"IMT Vision—Framework and overall objectives of the future development of IMT for 2020 and beyond", Recommendation ITU-R M.2083-0(Sep. 2015).
Kenichi Kuri et al,"Rate-matching Structure for IEEE 802.16m LDPC Codes ; C80216m-09_0164", IEEE Draft; C80216M-09_0164, IEEE-SA,Piscataway,NJ USA, vol. 802.16m, Jan. 6, 2009 (Jan. 6, 2009), pp. 1-7, XP068001380, [retrieved on Jan. 6, 2009] ,Section 2.1, figures 1,2.
LG Electronics: "Discussion on channel coding scheme considering NR KPIs", 3GPP Draft; R1-164563, 3rd Generation Partnership Project (3GPP), Mobile Competence Centre; 650, Route Des Lucioles ; F-06921 Sophia-Antipolis Cedex; France, vol. RAN WG1, no. Nanjing, China; 20160523-20160527, May 14, 2016 (May 14, 2016), XP051096376, Retrieved from the Internet: URL:http://www.3gpp.org/ftp/tsg_ran/WG1_RL1/TSGR1_85/Docs/, [retrieved on May 14, 2016] Sections 1 and 2.3.
U.S. Appl. No. 62/365,818, filed Jul. 22, 2016.
3GPP TS 36.212 V13.9.0 (Jun. 2019) 3rd Generation Partnership Project; Technical Specification Group Radio Access Network; Evolved Universal Terrestrial Radio Access (E-UTRA), Multiplexing and channel coding (Release 13).
Jean Dion et al., "A generic and reconfigurable FEC Transceiver for Multi-RAT Platform", ETSI Workshop on Future Radio Technologies-Air Interfaces, Jan. 27-28, 2016, Sophia Antipolis France.

* cited by examiner

BASE STATION APPARATUS, TERMINAL APPARATUS, AND COMMUNICATION METHOD

TECHNICAL FIELD

The present invention relates to a base station apparatus, a terminal apparatus, and a communication method.

BACKGROUND ART

In a communication system such as Long Term Evolution (LTE) or LTE-Advanced (LTE-A) of which specifications have been defined by the Third Generation Partnership Project (3GPP), the communication area can be widened by taking a cellular configuration in which areas covered by base station apparatuses (base stations, transmission stations, transmission points, downlink transmission devices, uplink reception devices, a group of transmit antennas, a group of transmit antenna ports, component carriers, eNodeB, access points, AP) or transmission stations equivalent to the base station apparatuses are arranged in the form of multiple cells (Cells) being linked together. The base station apparatus is connected with terminal apparatuses (reception stations, reception points, downlink reception devices, uplink transmission devices, a group of receive antennas, a group of receive antenna ports, UE, stations, STA). In such a cellular configuration, frequency efficiency can be improved by using the same frequency among neighboring cells or sectors.

Aiming at starting commercial services around 2020, research and development activities for the fifth generation mobile communications system (5G system) have been actively carried out. In recent years, the International Telecommunication Union Radio communications Sector (ITU-R) which is an international standardization institution, has made a report recommending its vision for the standard scheme for the 5G system (International mobile telecommunication—2020 and beyond: IMT-2020) (see NPL 1).

In the 5G system, in order to meet various requirements represented by three major usage scenarios (Enhanced mobile broadband (EMBB), Enhanced Massive machine type communication (eMTC), Ultra-reliable and low latency communication (URLLC)), it is assumed that various frequency bands are combined to operate a radio access network.

CITATION LIST

Non Patent Literature

NPL 1: "IMT Vision—Framework and overall objectives of the future development of IMT for 2020 and beyond," Recommendation ITU-R M. 2083-0, September 2015.

SUMMARY OF INVENTION

Technical Problem

However, three major usage scenarios in the 5G system are assumed to involve communication parameters, and communication schemes such as a modulation scheme and an error correction coding scheme that are suitable to each of the scenarios. The 5G system is required to be a system integrating communication suitable for three major usage scenarios while maintaining such communication.

The present invention has been made in consideration of such a circumstance, and has an object to provide a base station apparatus, a terminal apparatus, and a communication method which are capable of improving communication performance such as a throughput and a communication efficiency in a system where multiple communication methods are used.

Solution to Problem

To address the above-mentioned drawbacks, a base station apparatus, a terminal apparatus, and a communication method according to the present invention are configured as follows.

A base station apparatus according to an aspect of the present invention includes a transmitter configured to transmit a transmit signal generated from transmission bits, wherein the transmitter includes a coding unit configured to generate the transmission bits by coding and rate matching, the coding unit includes a first coding unit, a first interleaving unit, a first bit selection unit, a second coding unit, a second interleaving unit, and a second bit selection unit, the first coding unit is configured to perform coding by a first coding scheme whose coding rate is prescribed, the first interleaving unit is configured to rearrange output bits of the first coding unit, the first bit selection unit is configured to select a prescribed number of bits from an initial position determined based on a redundancy version from the output bits of the first interleaving unit to generate the transmission bits, the second coding unit is configured to perform coding by a second coding scheme whose coding rate is prescribed, the second interleaving unit is configured to rearrange output bits of the second coding unit, the second bit selection unit is configured to select a prescribed number of bits from an initial position determined based on a redundancy version from the output bits of the second interleaving unit to generate the transmission bits, and the first bit selection unit and the second bit selection unit are different in the initial position based on the same redundancy version.

In the base station apparatus according to an aspect of the present invention, the number of the prescribed coding rates of the first coding scheme is one, and the number of the prescribed coding rates of the second coding scheme is more than one.

In the base station apparatus according to an aspect of the present invention, the number of the redundancy versions used for the first bit selection unit is different from the number of the redundancy versions used for the second bit selection unit.

In the base station apparatus according to an aspect of the present invention, the coding unit determines whether to perform coding by the first coding scheme or by the second coding scheme depending on a transport block size or a modulation and coding scheme (MCS).

A terminal apparatus according to an aspect of the present invention includes a transmitter configured to transmit a transmit signal generated from transmission bits, wherein the transmitter includes a coding unit configured to generate the transmission bits by coding and rate matching, the coding unit includes a first coding unit, a first interleaving unit, a first bit selection unit, a second coding unit, a second interleaving unit, and a second bit selection unit, the first coding unit is configured to perform coding by a first coding scheme whose coding rate is prescribed, the first interleaving unit is configured to rearrange output bits of the first coding unit, the first bit selection unit is configured to select a prescribed number of bits from an initial position determined based on a redundancy version from the output bits of the first interleaving unit to generate the transmission bits, the second coding unit is configured to perform coding by a second coding scheme whose coding rate is prescribed, the second interleaving unit is configured to rearrange output bits of the second coding unit, the second bit selection unit is configured to select a prescribed number of bits from an initial position determined based on a redundancy version from the output bits of the second interleaving unit to generate the transmission bits, and the first bit selection unit and the second bit selection unit are different in the initial position based on the same redundancy version.

In the terminal apparatus according to an aspect of the present invention, the number of the prescribed coding rates of the first coding scheme is one, and the number of the prescribed coding rates of the second coding scheme is more than one.

In the terminal apparatus according to an aspect of the present invention, the number of the redundancy versions used for the first bit selection unit is different from the number of the redundancy versions used for the second bit selection unit.

In the terminal apparatus according to an aspect of the present invention, the coding unit determines whether to perform coding by the first coding scheme or by the second coding scheme depending on a transport block size or a modulation and coding scheme (MCS).

A communication method according to an aspect of the present invention includes the step of (a) transmitting a transmit signal generated from transmission bits, wherein the step (a) includes (b) generating the transmission bits by coding and rate matching, the step (b) includes (c) first coding, (d) first interleaving, (e) first bit selecting, (1) second coding, (g) second interleaving, and (h) second bit selecting, the step (c) includes performing coding by a first coding scheme whose coding rate is prescribed, the step (d) includes rearranging output bits in the step (c), the step (e) includes selecting a prescribed number of bits from an initial position determined based on a redundancy version from the output bits in the step (d) to generate the transmission bits, the step (f) includes performing coding by a second coding scheme whose coding rate is prescribed, the step (g) includes rearranging output bits of the second coding unit, the step (h) includes selecting a prescribed number of bits from an initial position determined based on a redundancy version from the output bits in the step (g) to generate the transmission bits, and the step (e) and the step (h) are different in the initial position based on the same redundancy version.

Advantageous Effects of Invention

According to the present invention, communication performance can be improved in a system using multiple communication methods.

DESCRIPTION OF EMBODIMENTS

A communication system according to the present embodiment includes a base station apparatus (a transmitter, cells, a transmission point, a group of transmit antennas, a group of transmit antenna ports, component carriers, eNodeB) and terminal apparatuses (a terminal, a mobile terminal, a reception point, a reception terminal, a receiver, a group of receive antennas, a group of receive antenna ports, UE). A base station apparatus connecting (establishing a radio link) with the terminal apparatus is referred to as a serving cell.

The base station apparatus and terminal apparatus in the present embodiment can communicate at a frequency band requiring to be licensed (licensed band) and/or a frequency band not requiring to be licensed (unlicensed band).

According to the present embodiment, "X/Y" includes the meaning of "X or Y". According to the present embodiment, "X/Y" includes the meaning of "X and Y". According to the present embodiment, "X/Y" includes the meaning of "X and/or Y".

Figure 1:
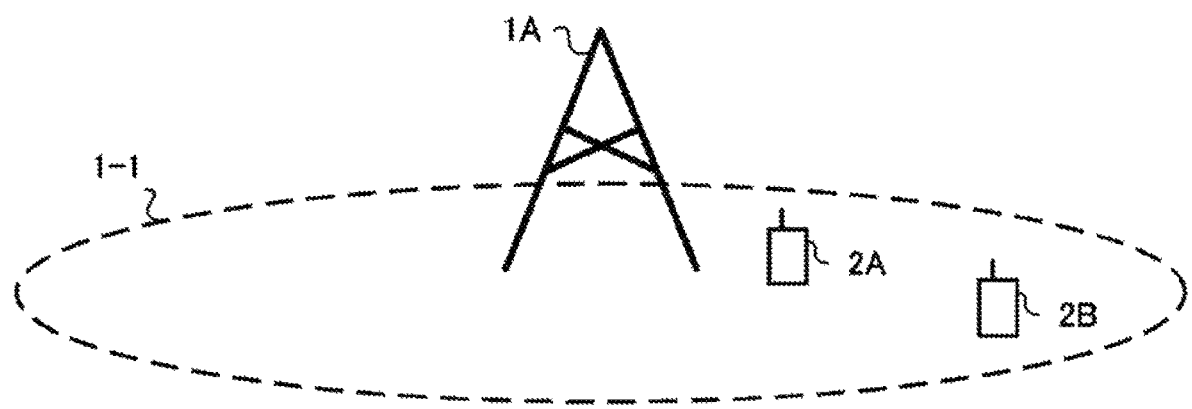
FIG. 1 is a diagram illustrating an example of a communication system according to the present embodiment.

FIG. 1 is a diagram illustrating an example of a communication system according to the present embodiment. As illustrated in FIG. 1, the communication system according to the present embodiment includes a base station apparatus 1A and terminal apparatuses 2A and 2B. A coverage 1-1 is a range (a communication area) in which the base station apparatus 1A can connect to the terminal apparatuses. The terminal apparatuses 2A and 2B are also collectively referred to as terminal apparatuses 2.

In FIG. 1, the following uplink physical channels are used for uplink radio communication from the terminal apparatus 2A to the base station apparatus 1A. The uplink physical channels are used for transmitting information output from a higher layer.

Physical Uplink Control Channel (PUCCH)
Physical Uplink Shared Channel (PUSCH)
Physical Random Access Channel (PRACH)

The PUCCH is used to transmit Uplink Control Information (UCI). The uplink control information includes a positive acknowledgement (ACK) or a negative acknowledgement (NACK) (ACK/NACK) for downlink data (a downlink transport block or a Downlink-Shared Channel (DL-SCH)). ACK/NACK for the downlink data is also referred to as HARQ-ACK or HARQ feedback.

Here, the uplink control information includes Channel State Information (CSI) for the downlink. The uplink control information includes a Scheduling Request (SR) used to request an Uplink-Shared Channel (UL-SCH) resource. The channel state information refers to a Rank Indicator (RI) specifying a suited spatial multiplexing number, a Precoding Matrix Indicator (PMI) specifying a suited precoder, a Channel Quality Indicator (CQI) specifying a suited transmission rate, a CSI-Reference Signal (RS) Resource Indication (CRI) indicating a suited CSI-RS resource, and the like.

The channel quality indicator (hereinafter, referred to as a CQI value) can be a suited modulation scheme (e.g., QPSK, 16QAM, 64QAM, 256QAM, or the like) and a suited coding rate in a predetermined band (details of which will be described later). The CQI value can be an index (CQI Index) determined by the above change scheme, coding rate, and the like. The CQI value can take a value determined beforehand in the system.

The rank indicator and the precoding quality indicator can take the values determined beforehand in the system. Each of the rank indicator, the precoding, matrix indicator, and the like can be an index determined by the number of spatial multiplexing, precoding matrix information, or the like. Note that values of the rank indicator, the precoding matrix indicator, and the channel quality indicator are collectively referred to as CSI values.

The PUSCH is used to transmit uplink data (an uplink transport block, UL-SCH). Furthermore, the PUSCH may be used to transmit the ACK/NACK and/or channel state information along with the uplink data. In addition, the PUSCH may be used to transmit the uplink control information only.

The PUSCH is used to transmit an RRC message. The RRC message is a signal/information that is processed in a Radio Resource Control (RRC) layer. Further, the PUSCH is used to transmit an MAC Control Element (CE). Here, The MAC CE is a signal/information that is processed (transmitted) in a Medium Access Control (MAC) layer.

For example, a power headroom may be included in the MAC CE and may be reported via the PUSCH. In other words, a MAC CE field may be used to indicate a level of the power headroom.

The PRACH is used to transmit a random access preamble.

In the uplink radio communication, an Uplink Reference Signal (UL RS) is used as an uplink physical signal. The uplink physical signal is not used to transmit information output from higher layers, but is used by the physical layer. The uplink reference signal includes a Demodulation Reference Signal (DMRS) and a Sounding Reference Signal (SRS).

The DMRS is associated with transmission of the PUSCH or the PUCCH. For example, the base station apparatus 1A uses DMRS in order to perform channel compensation of PUSCH or PUCCH. The SRS is not associated with the transmission of the PUSCH or the PUCCH. For example, the base station apparatus 1A uses the SRS to measure an uplink channel state.

In FIG. 1, the following downlink physical channels are used for the downlink radio communication from the base station apparatus 1A to the terminal apparatus 2A. The downlink physical channels are used for transmitting information output from the higher layers.

Physical Broadcast Channel (PBCH)
  Physical Control Format Indicator Channel (PCFICH)
  Physical Hybrid automatic repeat request Indicator Channel (PHICH)
  Physical Downlink Control Channel (PDCCH)
  Enhanced Physical Downlink Control Channel (EPDCCH)
  Physical Downlink Shared Channel (PDSCH)

The PBCH is used for broadcasting a Master Information Block (MIB, a Broadcast Channel (BCH)) that is shared by the terminal apparatuses. The PCFICH is used for transmission of information indicating a region (e.g., the number of Orthogonal Frequency Division Multiplexing (OFDM) symbols) to be used for transmission of the PDCCH.

The PHICH is used for transmission of an ACK/NACK with respect to the uplink data (a transport block, a codeword) received by the base station apparatus 1A. In other words, the PHICH is used for transmission of a HARQ indicator (HARQ feedback) indicating an ACK/NACK with respect to the uplink data. Note that an ACK/NACK is also called a HARQ-ACK. The terminal apparatus 2A reports to higher layers an ACK/NACK that has been received. The ACK/NACK refers to an ACK indicating a successful reception, a NACK indicating an unsuccessful reception, and a DTX indicating that no corresponding data is present. In a case that the PHICH for uplink data is not present, the terminal apparatus 2A reports an ACK to higher layers.

The PDCCH and the EPDCCH are used to transmit Downlink Control Information (DCI). Here, multiple DCI formats are defined for transmission of the downlink control information. In other words, a field for the downlink control information is defined in a DCI format and is mapped to information bits.

For example, as a DCI format for the downlink, DCI format 1A to be used for the scheduling of one PDSCH in one cell (transmission of a single downlink transport block) is defined.

For example, the DCI format for the downlink includes the downlink control information such as information on PDSCH resource allocation, information on a Modulation and Coding Scheme (MCS) for PDSCH, a TPC command for PUCCH, and the like. Here, the DCI format for the downlink is also referred to as downlink grant (or downlink assignment).

Furthermore, for example, as a DCI format for the uplink, DCI format 0 to be used for the scheduling of one PUSCH in one cell (transmission of a single uplink transport block) is defined.

For example, the DCI format for the uplink includes the uplink control information such as information on PUSCH resource allocation, information on MCS for PUSCH, a TPC command for PUSCH, and the like. Here, the DCI format for the uplink is also referred to as uplink grant (or uplink assignment).

Further, the DCI format for the uplink can be used to request the downlink Channel State Information (CSI) (which is also called reception quality information) (CSI request).

The DCI format for the uplink can be used for a configuration indicating an uplink resource to which a CSI feedback report is mapped, the CSI feedback report being fed back to the base station apparatus by the terminal apparatus. For example, the CSI feedback report can be used for a configuration indicating an uplink resource for periodically reporting Channel State Information (Periodic CSI). The CSI feedback report can be used for a mode configuration (CSI report mode) to periodically report the channel state information.

For example, the CSI feedback report can be used for a configuration indicating an uplink resource to report aperiodic channel state information (Aperiodic CSI). The CSI feedback report can be used for a mode configuration (CSI report mode) to aperiodically report the channel state information. The base station apparatus can configure any one of the periodic CSI feedback report and the aperiodic CSI feedback report. In addition, the base station apparatus can configure both the periodic CSI feedback report and the aperiodic CSI feedback report.

The DCI format for the uplink can be used for a configuration indicating a type of the CSI feedback report that is fed back to the base station apparatus by the terminal apparatus. The type of the CSI feedback report includes wideband CSI (e.g., Wideband CQI), narrowband CSI (e.g., Subband CQI), and the like.

In a case where a PDSCH resource is scheduled in accordance with the downlink assignment, the terminal apparatus receives downlink data on the scheduled PDSCH. In a case where a PUSCH resource is scheduled in accordance with the uplink grant, the terminal apparatus transmits uplink data and/or uplink control information on the scheduled PUSCH.

The PDSCH is used to transmit downlink data (a downlink transport block, DL-SCH). The PDSCH is used to transmit a system information block type 1 message. The system information block type 1 message is cell-specific information.

The PDSCH is used to transmit a system information message. The system information message includes a system information block X other than the system information block type 1. The system information message is cell-specific information.

The PDSCH is used to transmit an RRC message. Here, the RRC message transmitted from the base station apparatus may be shared by multiple terminal apparatuses in a cell. Further, the RRC message transmitted from the base station apparatus 1A may be a dedicated message to a given terminal apparatus 2 (also referred to as dedicated signaling). In other words, user-equipment-specific information (unique to user equipment) is transmitted using a message dedicated to the given terminal apparatus. The PDSCH is used for transmission of MAC CE.

Here, the RRC message and/or MAC CE is also referred to as higher layer signaling.

The PDSCH can be used to request the downlink channel state information. The PDSCH can be used for transmission of an uplink resource to which a CSI feedback report is mapped, the CSI feedback report being fed back to the base station apparatus by the terminal apparatus. For example, the CSI feedback report can be used for a configuration indicating an uplink resource for periodically reporting channel state information (Periodic CSI). The CSI feedback report can be used for a mode configuration (CSI report mode) to periodically report the channel state information.

The type of the downlink CSI feedback report includes wideband CSI (e.g., Wideband CSI) and narrowband CSI (e.g., Subband CSI). The wideband CSI calculates one piece of channel state information for the system band of a cell. The narrowband CSI divides the system band into predetermined units, and calculates one piece of channel state information for each division.

In the downlink radio communication, a Synchronization signal (SS) and a Downlink Reference Signal (DL RS) are used as downlink physical signals. The downlink physical signals are not used for transmission of information output from the higher layers, but are used by the physical layer.

The synchronization signal is used for the terminal apparatus to take synchronization in the frequency domain and the time domain in the downlink. The downlink reference signal is used for the terminal apparatus to perform channel compensation on a downlink physical channel. For example, the downlink reference signal is used for the terminal apparatus to calculate the downlink channel state information.

Here, the downlink reference signals include a Cell-specific Reference Signal (CRS), a UE-specific Reference Signal (URS) or a terminal apparatus-specific reference signal associated with the PDSCH, a Demodulation Reference Signal (DMRS) associated with the EPDCCH, a Non-Zero Power Chanel State Information-Reference Signal (NZP CSI-RS), and a Zero Power Chanel State Information-Reference Signal (ZP CSI-RS).

The CRS is transmitted in all bands of a subframe and is used to perform demodulation of the PBCH/PDCCH/PHICH/PCFICH/PDSCH. The URS associated with the PDSCH is transmitted in a subframe and a band that are used for transmission of the PDSCH to which the URS relates, and is used to demodulate the PDSCH with which the URS is associated.

The DMRS associated with the EPDCCH is transmitted in a subframe and a band that are used for transmission of the EPDCCH with which the DMRS is associated. The DMRS is used to demodulate the EPDCCH with which the DMRS is associated.

A resource for the NZP CSI-RS is configured by the base station apparatus 1A. The terminal apparatus 2A performs signal measurement (channel measurement), using the NZP CSI-RS. A resource for the ZP CSI-RS is configured by the base station apparatus 1A. With zero output, the base station apparatus 1A transmits the ZP CSI-RS. The terminal apparatus 2A performs interference measurement in a resource to which the NZP CSI-RS corresponds, for example.

A Multimedia Broadcast multicast service Single Frequency Network (MBSFN) RS is transmitted in all bands of the subframe used for transmitting the PMCH. The MBSFN RS is used to demodulate the PMCH. The PMCH is transmitted on the antenna port used for transmission of the MBSFN RS.

Here, the downlink physical channel and the downlink physical signal are also collectively referred to as a downlink signal. The uplink physical channel and the uplink physical signal are also collectively referred to as an uplink signal. The downlink physical channels and the uplink physical channels are collectively referred to as physical channels. The downlink physical signals and the uplink physical signals are also collectively referred to as physical signals.

The BCH, UL-SCH, and DL-SCH are transport channels. Channels used in the MAC layer are referred to as transport channels. A unit of the transport channel used in the MAC layer is also referred to as a Transport Block (TB) or a MAC Protocol Data Unit (PDU). The transport block is a unit of data that the MAC layer delivers to the physical layer. In the physical layer, the transport block is mapped to a codeword, and a coding process is performed for each codeword.

The base station apparatus can communicate integrally multiple Component Carriers (CCs) for broader-band transmission with the terminal apparatus supporting Carrier Aggregation (CA). In carrier aggregation, one Primary Cell (PCell) and one or multiple Secondary Cells (SCells) are configured as a set of serving cells.

In Dual Connectivity (DC), a Master Cell Group (MCG) and a Secondary Cell Group (SCG) are configured as a group of serving cells. The MCG is constituted by the PCell and optionally one or multiple SCells. The SCG is constituted by a primary SCell (PSCell) and optionally one or multiple SCells.

Figure 2:
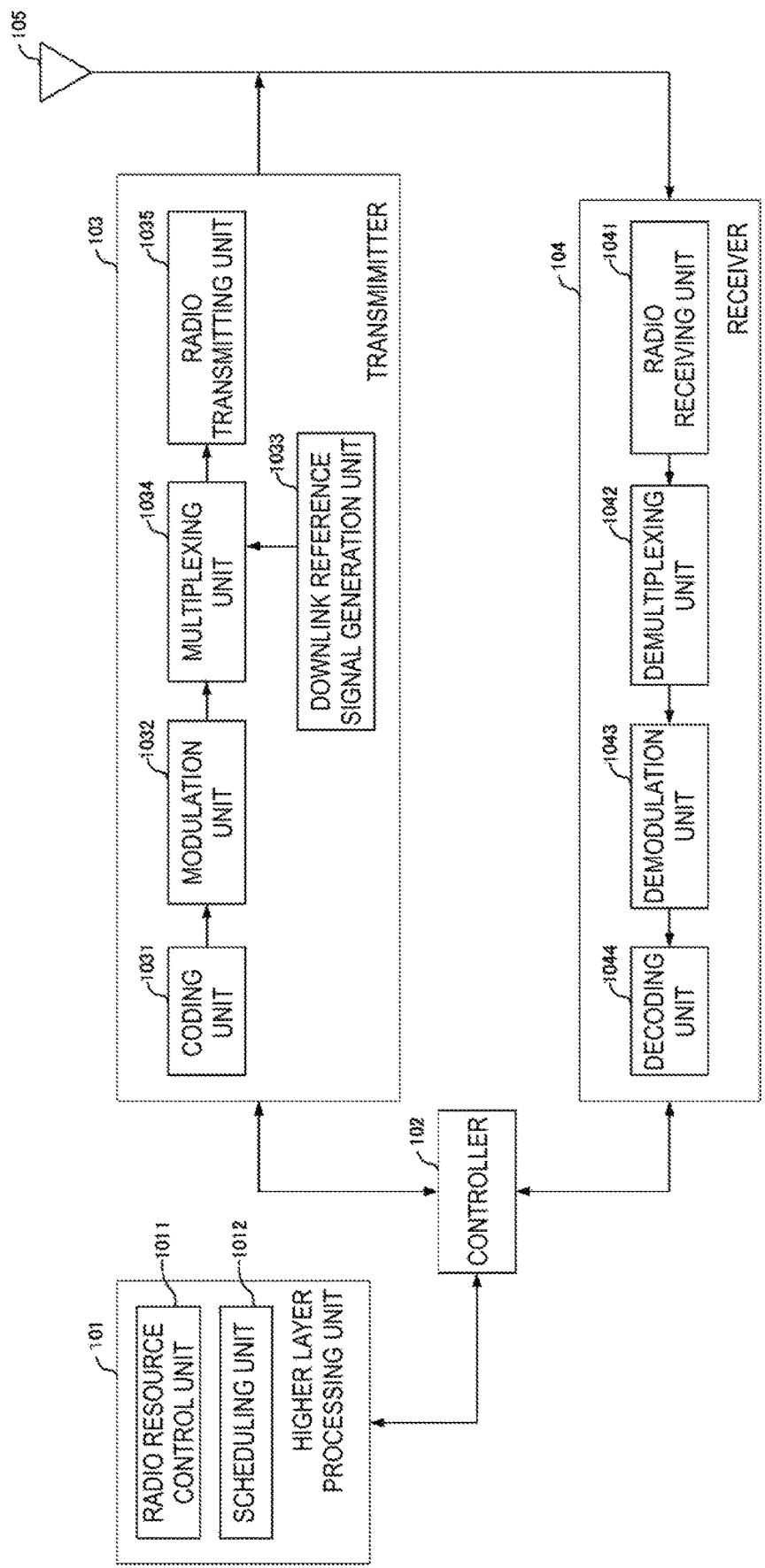
FIG. 2 is a block diagram illustrating a configuration example of a base station apparatus according to the present embodiment.

FIG. 2 is a schematic block diagram illustrating a configuration of the base station apparatus 1A according to the present embodiment. As illustrated in FIG. 2, the base station apparatus 1A is configured to include a higher layer processing unit (higher layer processing step) 101, a controller (controlling step) 102, a transmitter (transmitting step) 103, a receiver (receiving step) 104, and a transmit and receive antenna 105. The higher layer processing unit 101 is configured, including a radio resource controller (radio resource controlling step) 1011 and a scheduling unit (scheduling step) 1012. The transmitter 103 is configured, including a coding unit (coding step) 1031, a modulation unit (modulating step) 1032, a downlink reference signal generation unit (downlink reference signal generating step) 1033, a multiplexing unit (multiplexing step) 1034, and a radio transmitting unit (radio transmitting step) 1035. The receiver 104 is configured, including a radio receiving unit (radio receiving step) 1041, a demultiplexing unit (demultiplexing step) 1042, a demodulation unit (demodulating step) 1043, and a decoding unit (decoding step) 1044.

The higher layer processing unit 101 performs processing of the Medium Access Control (MAC) layer, the Packet Data Convergence Protocol (PDCP) layer, the Radio Link Control (RLC) layer, and the Radio Resource Control (RRC) layer. Furthermore, the higher layer processing unit 101 generates information necessary for control of the transmitter 103 and the receiver 104, and outputs the generated information to the controller 102.

The higher layer processing unit 101 receives information on a terminal apparatus, such as UE capability or the like, from the terminal apparatus. In other words, the terminal apparatus transmits its function to the base station apparatus by higher layer signaling.

Note that in the following description, information on a terminal apparatus includes information indicating whether the stated terminal apparatus supports a prescribed function, or information indicating that the stated terminal apparatus has completed the introduction and test of a prescribed function. In the following description, information on whether the prescribed function is supported includes information on whether the introduction and test of the prescribed function have been completed.

For example, in a case where a terminal apparatus supports a prescribed function, the stated terminal apparatus transmits information (parameters) indicating whether the prescribed function is supported. In a case where a terminal apparatus does not support a prescribed function, the stated terminal apparatus does not transmit information (parameters) indicating whether the prescribed function is supported. In other words, whether the prescribed function is supported is reported by whether information (parameters) indicating whether the prescribed function is supported is transmitted. Information (parameters) indicating whether a prescribed function is supported may be reported using one bit of 1 or 0.

The radio resource control unit 1011 generates, or acquires from a higher node, the downlink data (the transport block) mapped to the downlink PDSCH, system information, the RRC message, the MAC CE, and the like. The radio resource control unit 1011 outputs the downlink data to the transmitter 103, and outputs other information to the controller 102. Furthermore, the radio resource control unit 1011 manages various configuration information on the terminal apparatuses.

The scheduling unit 1012 determines a frequency and a subframe to which the physical channels (PDSCH and PUSCH) are allocated, the coding rate and modulation scheme (or MCS) for the physical channels (PDSCH and PUSCH), the transmit power, and the like. The scheduling unit 1012 outputs the determined information to the controller 102.

The scheduling unit 1012 generates the information to be used for the scheduling of the physical channels (PDSCH and PUSCH), based on the result of the scheduling. The scheduling unit 1012 outputs the generated information to the controller 102.

Based on the information input from the higher layer processing unit 101, the controller 102 generates a control signal for controlling of the transmitter 103 and the receiver 104. The controller 102 generates the downlink control information based on the information input from the higher layer processing unit 101, and outputs the generated information to the transmitter 103.

The transmitter 103 generates the downlink reference signal in accordance with the control signal input from the controller 102, codes and modulates the HARQ indicator, the downlink control information, and the downlink data that are input from the higher layer processing unit 101, multiplexes PHICH, PDCCH, EPDCCH, PDSCH, and the downlink reference signal, and transmits a signal obtained through the multiplexing to the terminal apparatus 2 through the transmit and receive antenna 105.

The coding unit 1031 codes the HARQ indicator, the downlink control information, and the downlink data that are input from the higher layer processing unit 101, in compliance with the predefined coding scheme, such as block coding, Low Density Parity Check (LDPC) coding, convolutional coding, or turbo coding, or in compliance with the coding scheme determined by the radio resource control unit 1011.

Figure 3:
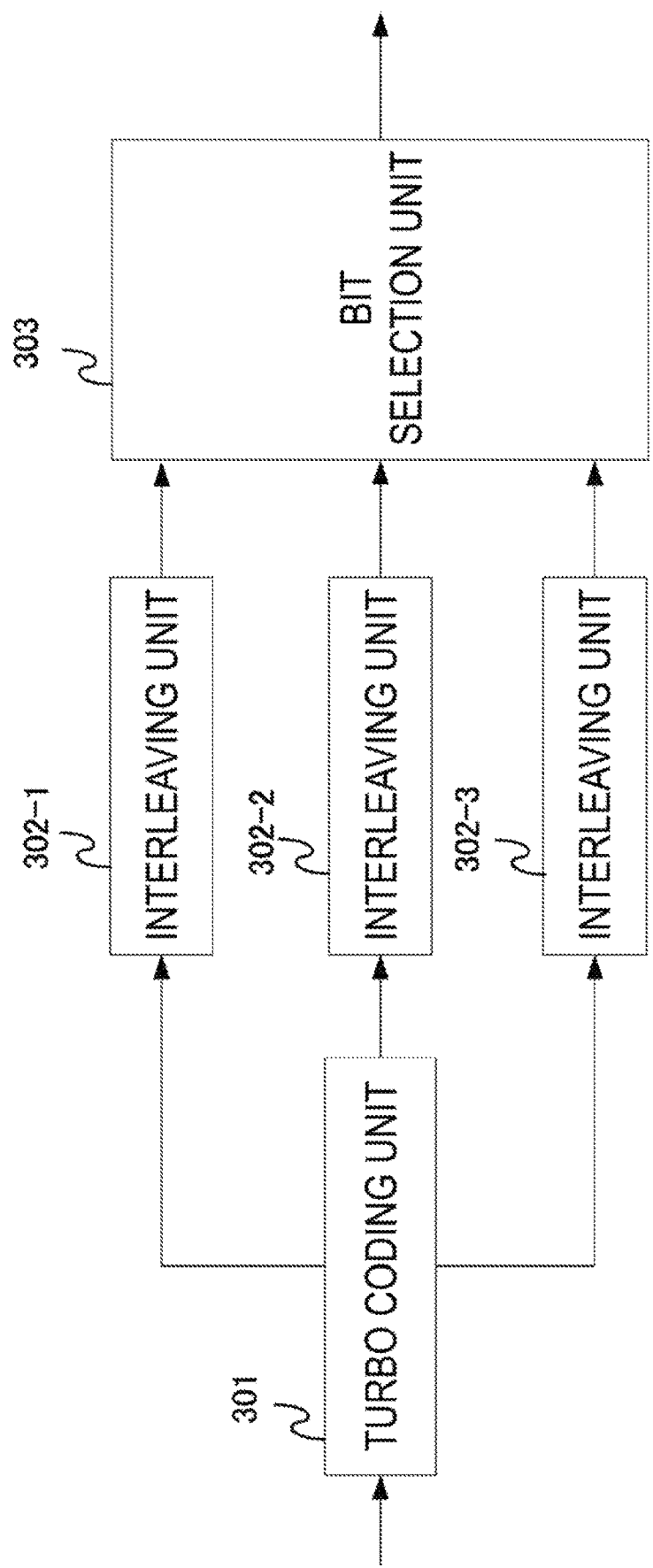
FIG. 3 is a diagram illustrating a configuration example of a coding unit according to the present embodiment.

FIG. 3 is a schematic block diagram illustrating a configuration example of the coding unit 1031 in turbo coding. In the example in FIG. 3, the coding unit 1031 includes a turbo coding unit (turbo coding step) 301, interleaving units (interleaving step) 302-1 to 302-3, and a bit selection unit (bit selecting step) 303. The turbo coding unit 301 performs coding at a mother coding rate. In the example in FIG. 3, the mother coding rate is 1/3. At this time, the turbo coding unit 301 outputs three sequences, specifically a systematic bit sequence, a first parity bit sequence, and a second parity bit sequence. The interleaving units 302-1 to 302-3 are sub-block interleavers respectively interleaving the Systematic bit sequence, the first parity bit sequence, and the second parity bit sequence. The interleaving units 302-1 to 302-3 are provided by three blocks for performing parallel processing, but one interleaving unit may be used in a case of serial processing.

The bit selection unit 303 performs rate matching. The bit selection unit 303 selects a bit sequence such that a rate (the number of bits) is one determined depending on a Redundancy Version (RV), the rate matching, or the like, and outputs the bit sequence to be transmitted. A coded bit sequence is retained until the terminal apparatus correctly receives information data. The retained coded bit sequence can be used for the HARQ.

Figure 4:
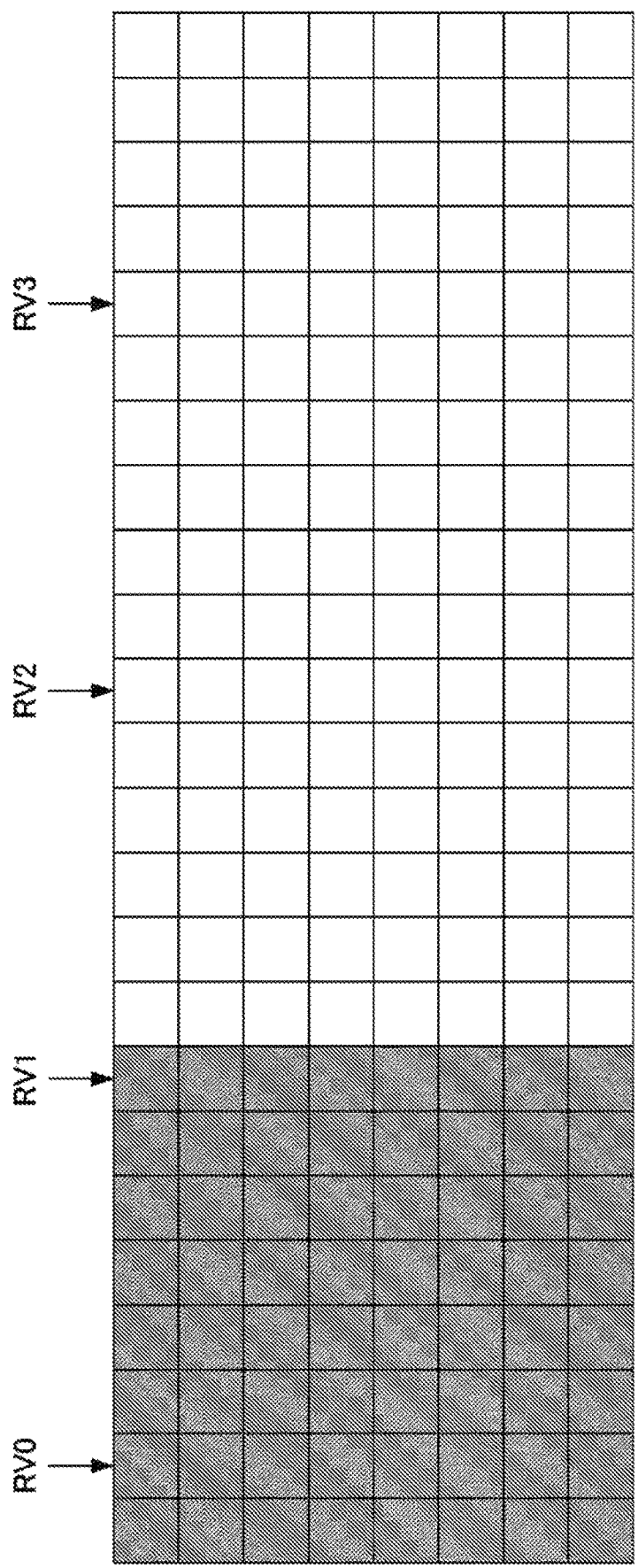
FIG. 4 is a diagram illustrating an operation example of a bit selection unit according to the present embodiment.

FIG. 4 is a diagram illustrating an operation example of a bit selection unit 303. FIG. 4 illustrates a two-dimensional Circular buffer. The interleaved coded bits are mapped to rectangles in the figure. The systematic bit sequence is mapped to hatched areas, and the first parity bit sequence and the second parity bit sequence are alternately mapped to blank areas in a longitudinal direction. From the mapped bit sequence, the required number of bits are read out from an initial position (starting position) based on the RV in the longitudinal direction. In the Long Term Evolution (LTE), there are four kinds of RVs. Here, four kinds of RVs are represented by RV0 to RV3. RV0 to RV3 represent cases that values of the RVs are 0, 1, 2, and 3, respectively. RV0 includes the largest number of systematic bits among the RVs. In a case of an initial transmission, RV0 is used generally. In a case of a retransmission, any of RV0 to RV3 is used. The RV to be used may be determined depending on the number of retransmissions.

Figure 5:
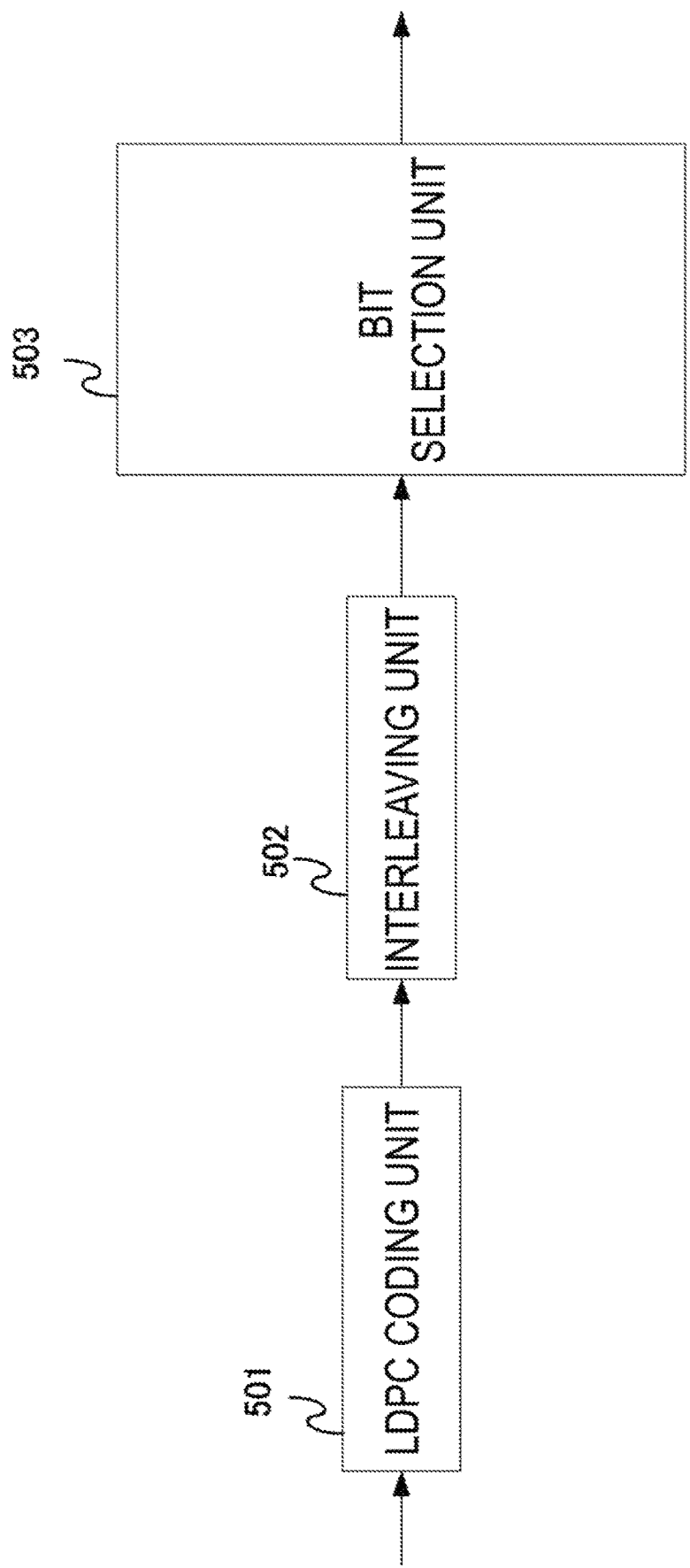
FIG. 5 is a diagram illustrating a configuration example of the coding unit according to the present embodiment.

FIG. 5 is a schematic block diagram illustrating a configuration example of the coding unit 1031 in LDPC coding. In the example in FIG. 5, the coding unit 1031 includes a LDPC coding unit (LDPC coding step) 501, an interleaving unit (interleaving step) 502, and a bit selection unit (bit selecting step) 503. The LDPC coding unit 501 performs LPDC coding at the mother coding rate which is a coding rate of 1/3, for example. In the LDPC coding, coding is performed using a generating matrix. The coding unit 1031 can use the generating matrixes differently depending on a coding block size, a transport block size, or a MCS. In a case of the LDPC coding, the interleaving unit 502 is not necessarily required.

Figure 6:
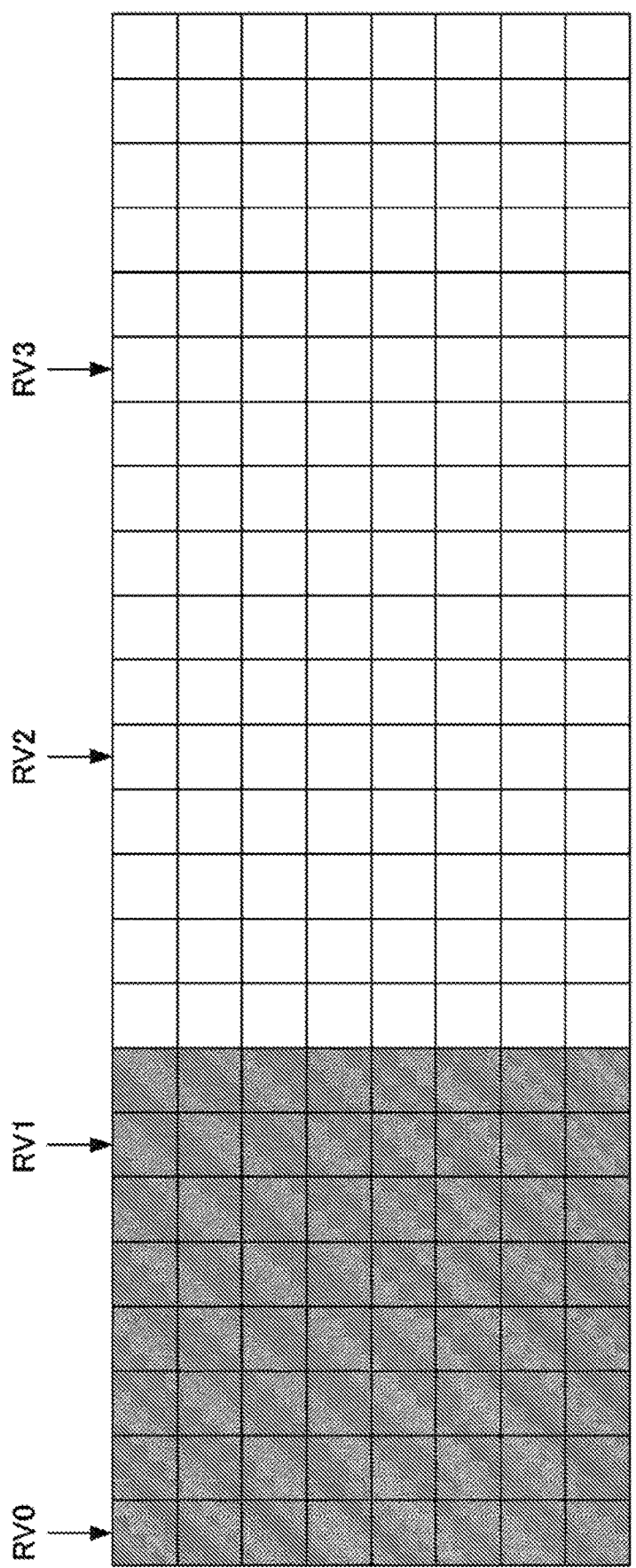
FIG. 6 is a diagram illustrating an operation example of the bit selection unit according to the present embodiment.

FIG. 6 is a diagram illustrating an operation example of the bit selection unit 503. FIG. 6 illustrates a two-dimensional Circular buffer. The interleaved coded bits are mapped to rectangles in the figure. The systematic bit sequence is mapped to hatched areas, and the parity bit sequence is mapped to white areas in the longitudinal direction. From the mapped bit sequence, the required number of bits are read out from an initial position (starting position) based on the RV in the longitudinal direction. The RV represents four kinds, RV0 to RV3. This example is different from the example in FIG. 4 (i.e., the case of the turbo coding) in the read out position base on the RV. In the turbo coding, all systematic bits may not be transmitted in the case of RV0. At that time, a bit error rate is good in the turbo coding, but in the case of the LDPC coding, the bit error rate is good if the all systematic bits are transmitted. Therefore, in the LDPC coding, in the case of RV0, the sequence is read out from the head of the systematic bits and the all systematic bits are transmitted.

For example, the operation of the bit selection unit 503 may be provided based on the coding scheme applied to the coded bits input to the bit selection unit 503. For example, in a case that the coding scheme applied to the coded bits input to the bit selection unit 503 is one other than the turbo coding, the circular buffer may not be generated. In a case that the circular buffer is not generated, the operation of the bit selection unit 503 may be an operation to output the coded bits input to the bit selection unit 503. Outputting the coded bits input to the bit selection unit 503 may in other words mean that the terminal apparatus or the base station apparatus does not include the bit selection unit 503. In the case that the circular buffer is not generated, the operation of the bit selection unit 503 may be rate-matched such that a prescribed puncturing pattern is applied to the coded bits input to the bit selection unit 503. Here, a prescribed puncturing pattern may be provided based on a description in a specification or the like. A prescribed puncturing pattern may be provided based on higher layer signaling such as RRC signalling, or control information (or a control channel or the like) of a physical layer.

For example, in the case that the coding scheme applied to the coded bits input to the bit selection unit 503 is one other than the turbo coding, a set of RVs the number of which is not four may be configured for the circular buffer. Here, a set of RVs the number of which is not four may be a set of one, two, three, five, six, seven or eight RVs. The number of RVs in a set may be provided based on an upper limit of the number of retransmissions (e.g., an upper limit of the number of retransmissions in the HARQ, or the like) In a case that the coding scheme applied to the coded bits input to the bit selection unit 503 is the turbo coding, a set of four RVs (e.g., RV0 to RV3 in FIG. 4 or FIG. 6, or the like) may be configured for the circular buffer.

For example, a configuration for a set of RVs may be provided based on the coding scheme applied to the coded bits input to the bit selection unit 503. Here, the configuration for a set of RVs may be positions of the RVs configured for the circular buffer. In the case that the coding scheme applied to the coded bits input to the bit selection unit 503 is one other than the turbo coding, a first RV set (e.g., the positions of RV0 to RV3 illustrated in FIG. 6) may be configured for the circular buffer. In the case that the coding scheme applied to the coded bits input to the bit selection unit 303 is the turbo coding, a second RV set (e.g., the positions of RV0 to RV3 illustrated in FIG. 4) may be configured for the circular buffer.

The RV set may be selected from multiple RVs For example, the first RV set and the second RV set can include four RVs selected from eight RVs (from RV0 to a RV7). It is assumed that RV0 is an RV read out from the head of the systematic bits, and then RV0, RV2, RV4, and RV8 are selected for the first RV set in the case that the coding scheme is other coding scheme than the turbo coding such as the LDPC coding, and RV1, RV3, RV5, and RV7 are selected for the second RV set in the case that the coding scheme is the turbo coding. The RV included in the RV set may be configured by the base station apparatus or terminal apparatus, or a certain RV set may be selected from multiple RV sets (e.g., the first RV set and the second RV set) by the base station apparatus or terminal apparatus. In this way, in the example in which four RVs to be used are selected from eight RVs, the base station apparatus or the terminal apparatus can transmit the control information including two bits indicating the redundancy version. In this case, the base station apparatus or the terminal apparatus can identify four RVs of eight RVs from two bits indicating the received redundancy version.

Figure 7:
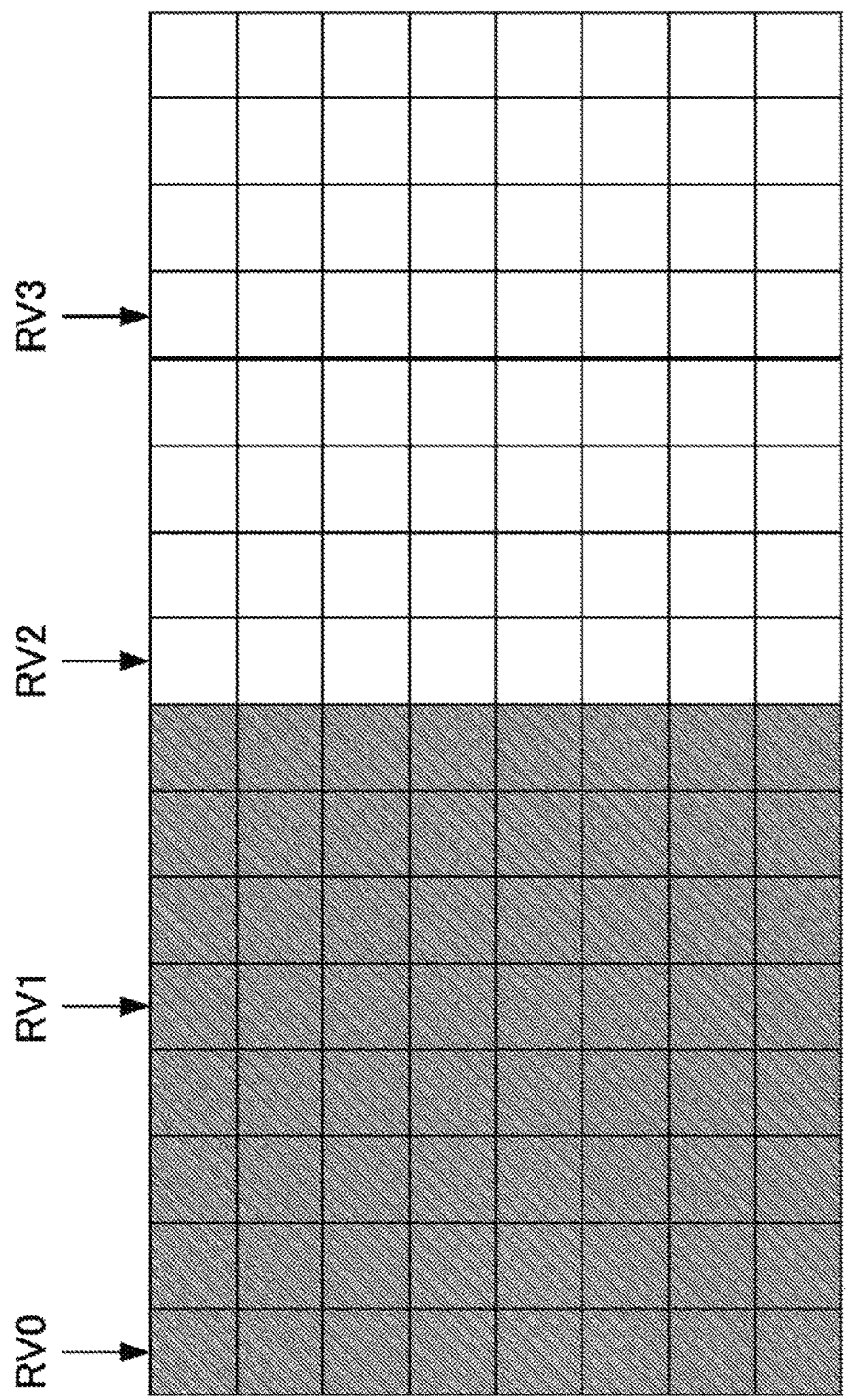
FIG. 7 is a diagram illustrating an operation example of the bit selection unit according to the present embodiment.
Figure 8:
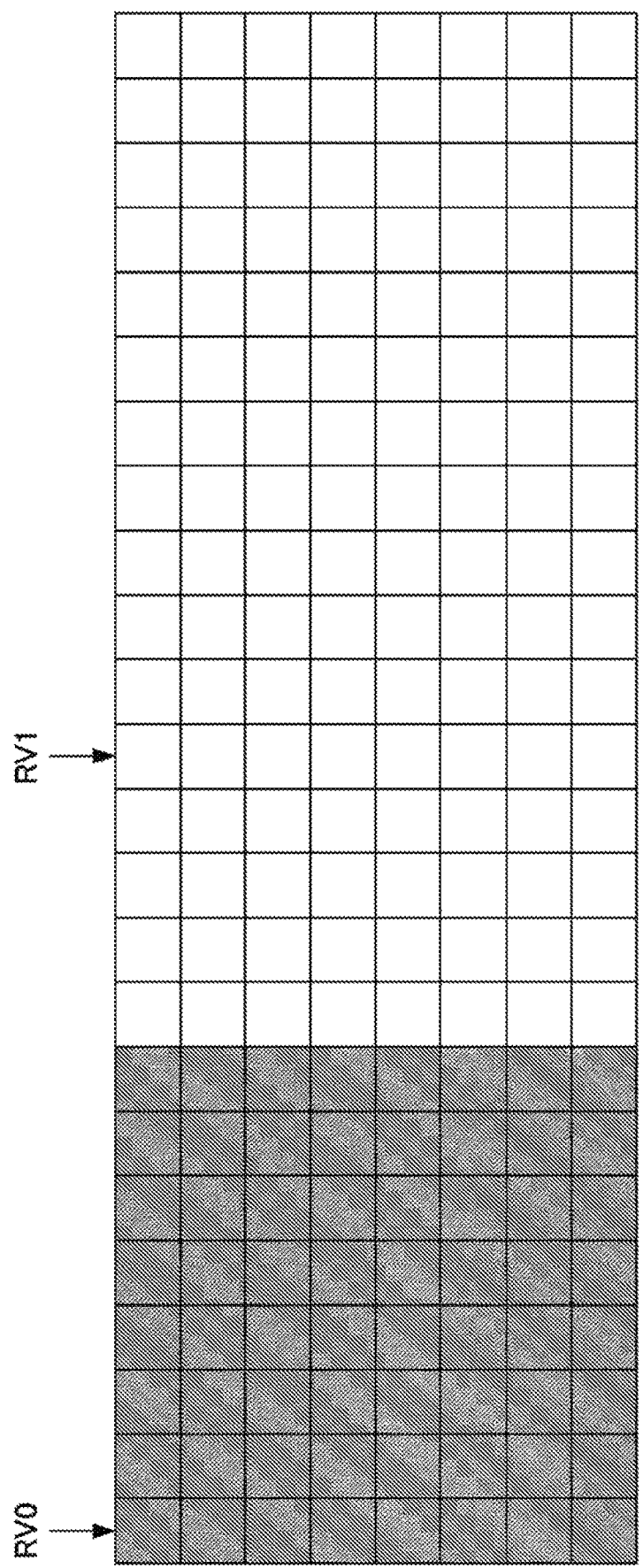
FIG. 8 is a diagram illustrating an operation example of the bit selection unit according to the present embodiment.
Figure 9:
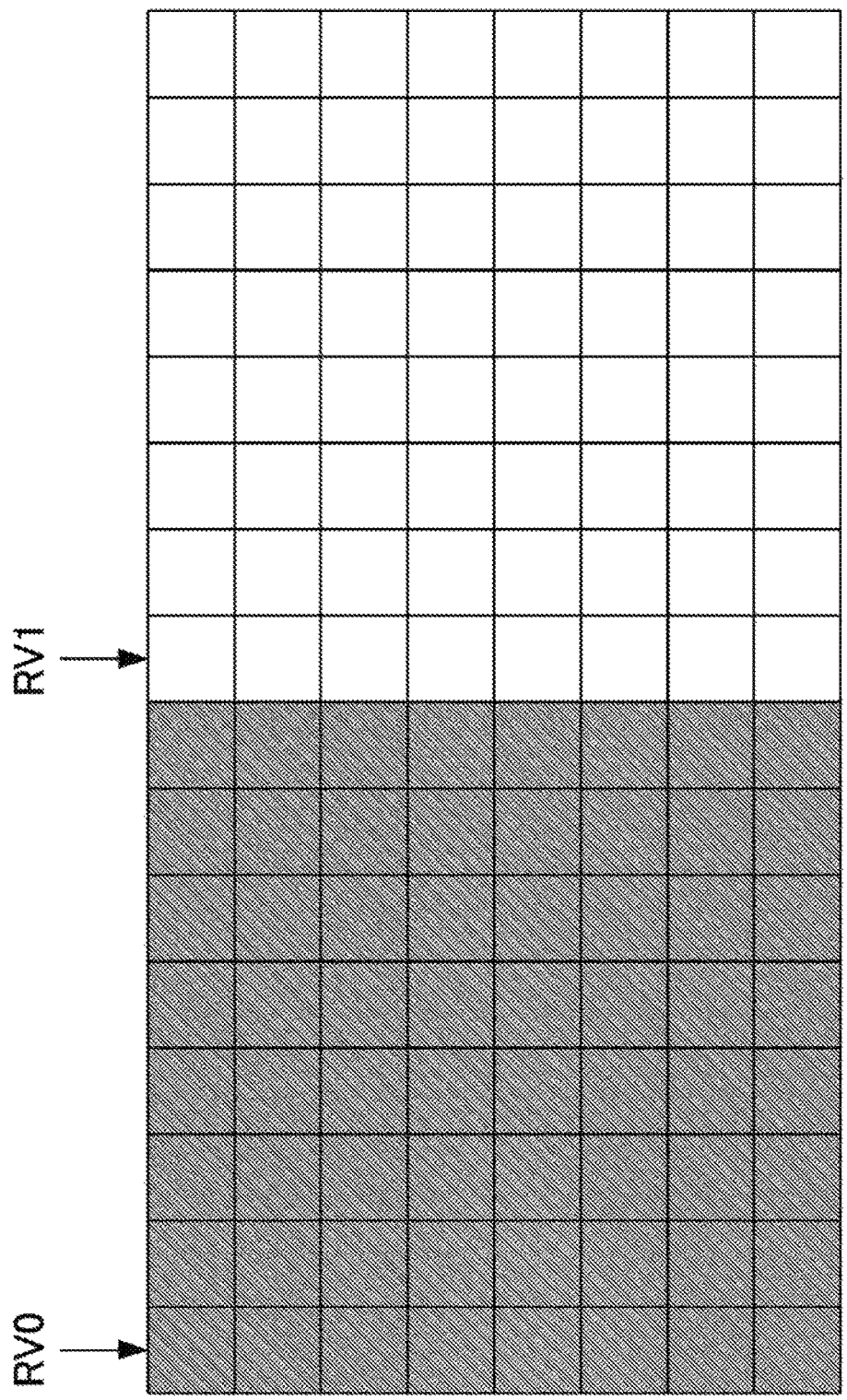
FIG. 9 is a diagram illustrating an operation example of the bit selection unit according to the present embodiment.

In the LDPC coding, rate matching performance by puncturing (bit selection) may not be good. For this reason, the LDPC coding can have (support) multiple mother coding rates. For example, the mother coding rate can be 1/3 or 1/2. FIG. 7 illustrates an operation example of the bit selection unit 503 in the case that the mother coding rate is 1/2. In the case that the LDPC coding has multiple mother coding rates, the bit selection patterns decrease, and thus, the number of RVs can be decreased. FIG. 8 illustrates a case that the mother coding rate is 1/3 and the number of RVs is two. FIG. 9 illustrates a case that the mother coding rate is 1/2 and the number of RVs is two. Switching between the mother coding rates 1/3 and 1/2 is performed based on the coding rate or the MCS. For example, in a case that the coding rate or the coding rate corresponding to the MCS is from 1/3 to 1/2, the mother coding rate can be 1/3. For example, in a case that the coding rate or the coding rate corresponding to the MCS exceeds 1/2, the mother coding rate can be 1/2.

The value of the coding rate or the number of RVs described in the above embodiment is merely an example, and a case involving different values is also included in the present invention. This is also applied to the following embodiments.

The coding unit 1031 can switch the coding schemes depending on the transport block size or an information bit length. For example, the turbo coding can be performed in a case that the transport block size is smaller, and the LDPC coding can be performed in a case that the transport block size is larger. The base station apparatus can indicate or transmit the transport block size or information bit length as a threshold to the terminal apparatus. The terminal apparatus can use the threshold indicated or transmitted by the base station apparatus to determine the coding scheme.

The coding unit 1031 can switch the coding schemes depending on a system bandwidth. The LDPC coding is higher in the performance as a code word length is longer. Therefore, for example, the coding unit 1031 can perform the turbo coding in a case that the system bandwidth is narrower than 20 MHz, and can perform the LDPC coding in a case that the system bandwidth is wider than 20 MHz. At this time, the terminal apparatus can perform decoding with the turbo code in the case that the system bandwidth is narrower than 20 MHz, and can perform decoding with the LDPC code in the case that the system bandwidth is wider than 20 MHz. The coding unit 1031 can switch the coding schemes depending on a carrier frequency. For example, the coding unit 1031 can perform the turbo coding in a case that the carrier frequency is 6 GHz or less, and can perform the LDPC coding in a case that the carrier frequency is 6 GHz or more. At this time, the terminal apparatus can perform decoding with the turbo code in the case that the carrier frequency is 6 GHz or less, and can perform decoding with the LDPC code in the case that the carrier frequency is 6 GHz or more.

The base station apparatus can transmit a transmit signal with a subcarrier spacing being varied. In this case, the coding unit 1031 can switch the coding schemes depending on the subcarrier spacing. For example, the coding unit 1031 can perform the turbo coding in a case that the subcarrier spacing is 15 KHz, and can perform the LDPC coding in a case that the subcarrier spacing is wider than 15 KHz. At this time, the terminal apparatus can perform decoding with the turbo code in the case that the subcarrier spacing is 15 KHz, and can perform decoding with the LDPC code in the case that the subcarrier spacing is wider than 15 KHz.

The coding unit 1031 can switch the coding schemes for each cell. For example, the coding unit 1031 can perform the turbo coding in the PCell, and can perform the turbo coding and/or LDPC coding in the PSCell/SCell.

The modulation unit 1032 modulates the coded bits input from the coding unit 1031, in compliance with the modulation scheme prescribed in advance, such as Binary Phase Shift Keying (BPSK), Quadrature Phase Shift Keying (QPSK), quadrature amplitude modulation (16QAM), 64QAM, or 256QAM, or in compliance with the modulation scheme determined by the radio resource control unit 1011.

The downlink reference signal generation unit 1033 generates, as the downlink reference signal, a sequence that is already known to the terminal apparatus 2A and that is acquired in accordance with a rule prescribed in advance based on the physical cell identity (PCI, cell ID) for identifying the base station apparatus 1A, and the like.

The multiplexing unit 1034 multiplexes the modulated modulation symbol of each channel, the generated downlink reference signal, and the downlink control information. To be more specific, the multiplexing unit 1034 maps the modulated modulation symbol of each channel, the generated downlink reference signal, and the downlink control information to the resource elements.

The radio transmitting unit 1035 performs Inverse Fast Fourier Transform (IFFT) on the modulation symbol resulting from the multiplexing or the like, generates an OFDM symbol, attaches a cyclic prefix (CP) to the generated OFDM symbol, generates a baseband digital signal, converts the baseband digital signal into an analog signal, removes unnecessary frequency components through filtering, up-converts a result of the removal into a signal of a carrier frequency, performs power amplification, and outputs a final result to the transmit and receive antenna 105 for transmission.

In accordance with the control signal input from the controller 102, the receiver 104 demultiplexes, demodulates, and decodes the reception signal received from the terminal apparatus 2A through the transmit and receive antenna 105, and outputs information resulting from the decoding to the higher layer processing unit 101.

The radio receiving unit 1041 converts an uplink signal received through the transmit and receive antenna 105 into a baseband signal by down-converting, removes unnecessary frequency components, controls the amplification level in such a manner as to suitably maintain a signal level, performs orthogonal demodulation based on an in-phase component and an orthogonal component of the received signal, and converts the resulting orthogonally-demodulated analog signal into a digital signal.

The radio receiving unit 1041 removes a portion corresponding to CP from the digital signal resulting from the conversion. The radio receiving unit 1041 performs Fast Fourier Transform (FFT) on the signal from which CP has been removed, extracts a signal in the frequency domain, and outputs the resulting signal to the demultiplexing unit 1042.

The demultiplexing unit 1042 demultiplexes the signal input from the radio receiving unit 1041 into the PUCCH, PUSCH, and a signal such as the uplink reference signal. The demultiplexing is performed based on radio resource allocation information that is determined in advance by the base station apparatus 1A using the radio resource control unit 1011 and that is included in the uplink grant notified to each of the terminal apparatuses 2.

Furthermore, the demultiplexing unit 1042 performs channel compensation of the PUCCH and the PUSCH. The demultiplexing unit 1042 demultiplexes the uplink reference signal.

The demodulation unit 1043 performs Inverse Discrete Fourier Transform (IDFT) on the PUSCH, acquires modulation symbols, and performs reception signal demodulation, that is, demodulates each of the modulation symbols of the PUCCH and PUSCH in compliance with the modulation scheme prescribed in advance, such as BPSK, QPSK, 16QAM, 64QAM, 256QAM, or the like, or in compliance with the modulation scheme that the base station apparatus 1A itself notified to each of the terminal apparatuses 2 in advance, with the uplink grant.

The decoding unit 1044 decodes the coded bits of the PUCCH and PUSCH, which have been demodulated, in compliance with a coding scheme prescribed in advance, a coding rate of the coding scheme being prescribed in advance or being notified in advance with the uplink grant to the terminal apparatus 2 by the base station apparatus 1A itself, and outputs the decoded uplink data and uplink control information to the higher layer processing unit 101. In a case where the PUSCH is re-transmitted, the decoding unit 1044 performs the decoding with the coded bits input from the higher layer processing unit 101 and retained in an HARQ buffer, and the demodulated coded bits.

Figure 10:
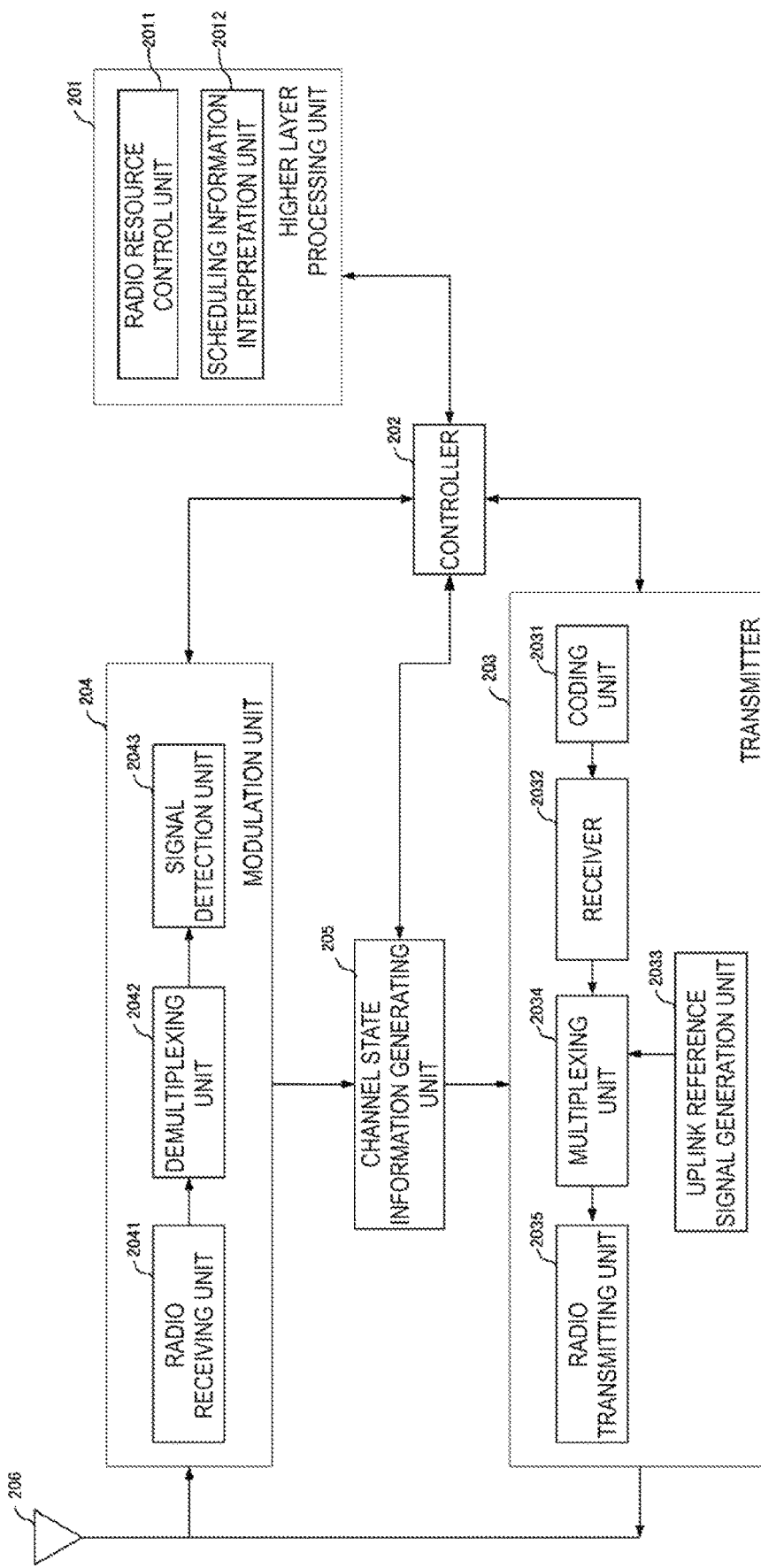
FIG. 10 is a block diagram illustrating a configuration example of a terminal apparatus according to the present embodiment.

FIG. 10 is a schematic block diagram illustrating a configuration of the terminal apparatus 2 according to the present embodiment. As illustrated in FIG. 10, the terminal apparatus 2A is configured to include a higher layer processing unit (higher layer processing step) 201, a controller (controlling step) 202, a transmitter (transmitting step) 203, a receiver (receiving step) 204, a channel state information generating unit (channel state information generating step)

205, and a transmit and receive antenna 206. The higher layer processing unit 201 is configured to include a radio resource control unit (radio resource controlling step) 2011 and a scheduling information interpretation unit (scheduling information interpreting step) 2012. The transmitter 203 is configured to include a coding unit (coding step) 2031, a modulation unit (modulating step) 2032, an uplink reference signal generation unit (uplink reference signal generating step) 2033, a multiplexing unit (multiplexing step) 2034, and a radio transmitting unit (radio transmitting step) 2035. The receiver 204 is configured to include a radio receiving unit (radio receiving step) 2041, a demultiplexing unit (demultiplexing step) 2042, and a signal detection unit (signal detecting step) 2043.

The higher layer processing unit 201 outputs the uplink data (the transport block) generated by a user operation or the like, to the transmitter 203. The higher layer processing unit 201 performs processing of the Medium Access Control (MAC) layer, the Packet Data Convergence Protocol (PDCP) layer, the Radio Link Control (RLC) layer, and the Radio Resource Control (RRC) layer.

The higher layer processing unit 201 outputs, to the transmitter 203, information indicating a terminal apparatus function supported by the terminal apparatus 2A itself.

Furthermore, the radio resource control unit 2011 manages various configuration information on the terminal apparatus 2A itself. Furthermore, the radio resource control unit 2011 generates information to be mapped to each uplink channel, and outputs the generated information to the transmitter 203.

The radio resource control unit 2011 acquires configuration information on CSI feedback transmitted from the base station apparatus, and outputs the acquired information to the controller 202.

The scheduling information interpretation unit 2012 interprets the downlink control information received through the receiver 204, and determines scheduling information. The scheduling information interpretation unit 2012 generates the control information in order to control the receiver 204 and the transmitter 203 in accordance with the scheduling information, and outputs the generated information to the controller 202.

Based on the information input from the higher layer processing unit 201, the controller 202 generates a control signal for controlling the receiver 204, the channel state information generating unit 205, and the transmitter 203. The controller 202 outputs the generated control signal to the receiver 204, the channel state information generating unit 205, and the transmitter 203 to control the receiver 204 and the transmitter 203.

The controller 202 controls the transmitter 203 to transmit CSI generated by the channel state information generating unit 205 to the base station apparatus.

In accordance with the control signal input from the controller 202, the receiver 204 demultiplexes, demodulates, and decodes a reception signal received from the base station apparatus 1A through the transmit and receive antenna 206, and outputs the resulting information to the higher layer processing unit 201.

The radio receiving unit 2041 converts a downlink signal received through the transmit and receive antenna 206 into a baseband signal by down-converting, removes unnecessary frequency components, controls an amplification level in such a manner as to suitably maintain a signal level, performs orthogonal demodulation based on an in-phase component and an orthogonal component of the received signal, and converts the resulting orthogonally-demodulated analog signal into a digital signal.

The radio receiving unit 2041 removes a portion corresponding to CP from the digital signal resulting from the conversion, performs fast Fourier transform on the signal from which CP has been removed, and extracts a signal in the frequency domain.

The demultiplexing unit 2042 demultiplexes the extracted signal into the PHICH, PDCCH, EPDCCH, PDSCH, and the downlink reference signal. Further, the demultiplexing unit 2042 performs channel compensation of the PHICH, PDCCH, and EPDCCH based on a channel estimation value of the desired signal obtained from the channel measurement, detects the downlink control information, and outputs the information to the controller 202. The controller 202 outputs the PDSCH and the channel estimation value of the desired signal to the signal detection unit 2043.

The signal detection unit 2043, using the PDSCH and the channel estimation value, detects, demodulates and decodes a signal, and outputs the resulting signal to the higher layer processing unit 201.

The signal detection unit 2043 performs the decoding in compliance with a coding scheme for the PDSCH transmitted from the base station apparatus. In a case that a coding scheme is indicated or configured for the signal detection unit 2043 by the base station apparatus, the signal detection unit 2043 uses the indicated coding scheme for the decoding. The signal detection unit 2043 can switch the coding schemes, based on some or all of the transport block size, information bit length, coding block size, coding rate, MCS, system bandwidth, carrier frequency, and subcarrier spacing of the signal received from the base station apparatus. For example, the signal detection unit 2043 can perform decoding with the turbo code in the case that the transport block size is smaller, and can perform decoding with the LDPC code in the case that the transport block size is larger. For example, the signal detection unit 2043 can perform decoding with the turbo code in the case that the system bandwidth is narrower than 20 MHz, and can perform decoding with the LDPC code in the case that the system bandwidth is wider than 20 MHz. For example, the signal detection unit 2043 can perform decoding with the turbo code in the case that the carrier frequency is 6 GHz or less, and can perform decoding with the LDPC code in the case that the carrier frequency is 6 GHz or more. For example, the signal detection unit 2043 can perform decoding with the turbo code in the case that the subcarrier spacing is 15 KHz, and can perform decoding with the LDPC code in a case that the subcarrier spacing is wider than 15 KHz.

The transmitter 203 generates the uplink reference signal in accordance with the control signal input from the controller 202, codes and modulates the uplink data (the transport block) input from the higher layer processing unit 201, multiplexes the PUCCH, PUSCH, and the generated uplink reference signal, and transmits a result of the multiplexing to the base station apparatus 1A through the transmit and receive antenna 206.

The coding unit 2031 codes the uplink control information or uplink data that are input from the higher layer processing unit 201, in compliance with the coding scheme prescribed in advance, such as convolutional coding, block coding, turbo coding, or Low Density Parity Check (LDPC) coding, or in compliance with the coding scheme determined by the radio resource control unit 2011.

A configuration example and operation of coding unit 2031 are the same as the coding unit 1031. Therefore, the description of the coding unit 2031 can be made in the same way as of the coding unit 1031 described above.

FIG. 3 is a schematic block diagram illustrating a configuration example of the coding unit 2031 in the turbo coding. In the example in FIG. 3, the coding unit 2031 includes a turbo coding unit (turbo coding step) 301, interleaving units (interleaving step) 302-1 to 302-3, and a bit selection unit (bit selecting step) 303. The turbo coding unit 301 performs coding at a mother coding rate. In the example in FIG. 3, the mother coding rate is 1/3. At this time, the turbo coding unit 301 outputs three sequences, or a systematic bit sequence, a first parity bit sequence, and a second parity bit sequence. The interleaving units 302-1 to 302-3 are subblock interleavers respectively interleaving the systematic bit sequence, the first parity bit sequence, and the second parity bit sequence. The interleaving units 302-1 to 302-3 are provided by three blocks for performing parallel processing, but one interleaving unit may be used in a case of serial processing. The bit selection unit 303 performs rate matching. The bit selection unit 303 selects a bit sequence such that a rate (the number of bits) is one determined depending on a Redundancy Version (RV), the rate matching, or the like, and outputs the bit sequence to be transmitted. A coded bit sequence is retained until the base station apparatus correctly receives information data. The retained coded bit sequence can be used for the HARQ.

FIG. 4 is a diagram illustrating an operation example of the bit selection unit 303. FIG. 4 illustrates a two-dimensional Circular buffer. The interleaved coded bits are mapped to rectangles in the figure. The systematic bit sequence is mapped to hatched areas, and the first parity bit sequence and the second parity bit sequence are alternately mapped to white areas in a longitudinal direction. From the mapped bit sequence, the required number of bits is read out from a starting position based on the RV in the longitudinal direction. In the Long Term Evolution (LTE), there are four kinds of RVs. Here, four kinds of RVs are represented by RV0 to RV3. RV0 to RV3 represent cases that values of the RVs are 0, 1, 2, and 3, respectively. RV0 includes the largest systematic bits among the RVs. In a case of an initial transmission, RV0 is used generally. In a case of a retransmission, any of RV0 to RV3 is used. The RV to be used may be determined depending on the number of retransmissions.

FIG. 5 is a schematic block diagram illustrating a configuration example of the coding unit 2031 in the LDPC coding. In the example in FIG. 5, the coding unit 2031 includes a LDPC coding unit (LDPC coding step) 501, an interleaving unit (interleaving step) 502, and a bit selection unit (bit selecting step) 503. The LDPC coding unit 501 performs the LPDC coding at the mother coding rate that is the coding rate of 1/3, for example. In the LDPC coding, coding is performed using a generating matrix. The coding unit 2031 can use the generating matrixes different depending on a coding block size, a transport block size, or a MCS. In a case of the LDPC coding, the interleaving unit 502 is not necessarily required.

FIG. 6 is a diagram illustrating an operation example of the bit selection unit 503. FIG. 6 illustrates a two-dimensional circular buffer. The interleaved coded bits are mapped to rectangles in the figure. The systematic bit sequence is mapped to hatched areas, and the parity bit sequence is mapped to white areas in the longitudinal direction.

From the mapped bit sequence, the required number of bits are read out from an initial position (starting position) based on the RV in the longitudinal direction. The RV represents four kinds, RV0 to RV3. This example is different from the example in FIG. 4 (i.e., the case of the turbo coding) in the read out position base on the RV. In the turbo coding, the all systematic bits may not be transmitted in the case of RV0. At that time, a bit error rate is good in the turbo coding, but in the case of the LDPC coding, the bit error rate is good if the all systematic bits are transmitted. Therefore, in the LDPC coding, in the case of RV0, the sequence is read out from the head of the systematic bits and the all systematic bits are transmitted.

For example, the operation of the bit selection unit 503 may be provided based on the coding scheme applied to the coded bits input to the bit selection unit 503. For example, in a case that the coding scheme applied to the coded bits input to the bit selection unit 503 is one other than the turbo coding, the circular buffer may not be generated. In a case that the circular buffer is not generated, the operation of the bit selection unit 503 may be an operation to output the coded bits input to the bit selection unit 503. Outputting the coded bits input to the bit selection unit 503 may in other words mean that the terminal apparatus or the base station apparatus does not include the bit selection unit 503. In the case that the circular buffer is not generated, the operation of the bit selection unit 503 may be rate-matched such that a prescribed puncturing pattern is applied to the coded bits input to the bit selection unit 503. Here, a prescribed puncturing pattern may be provided based on a description in a specification or the like. A prescribed puncturing pattern may be provided based on higher layer signaling such as RRC signalling, or control information (or a control channel or the like) of a physical layer.

For example, in the case that the coding scheme applied to the coded bits input to the bit selection unit 503 is one other than the turbo coding, a set of RVs the number of which is not four may be configured for the circular buffer. Here, a set of RVs the number of which is not four may be a set of one, two, three, five, six, seven or eight RVs. The number of RVs in a set may be provided based on an upper limit of the number of retransmissions (e.g., an upper limit of the number of retransmissions in the HARQ, or the like) In a case that the coding scheme applied to the coded bits input to the bit selection unit 503 is the turbo coding, a set of four RVs (e.g., RV0 to RV3 in FIG. 4 or FIG. 6, or the like) may be configured for the circular buffer.

For example, a configuration for a set of RVs may be provided based on the coding scheme applied to the coded bits input to the bit selection unit 503. Here, the configuration for a set of RVs may be positions of the RVs configured for the circular buffer. In the case that the coding scheme applied to the coded bits input to the bit selection unit 503 is one other than the turbo coding, a first RV set (e.g., the positions of RV0 to RV3 illustrated in FIG. 6) may be configured for the circular buffer. In the case that the coding scheme applied to the coded bits input to the bit selection unit 503 is the turbo coding, a second RV set (e.g., the positions of RV0 to RV3 illustrated in FIG. 4) may be configured for the circular buffer.

The RV set may be selected from multiple RVs. For example, the first RV set and the second RV set can include four RVs selected from eight RVs (from RV0 to a RV7). It is assumed that RV0 is an RV read out from the head of the systematic bits, and then RV0, RV2, RV4, and RV8 are selected for the first RV set in the case that the coding scheme is other coding scheme than the turbo coding such as the LDPC coding, and RV1, RV3, RV5, and RV7 are selected for the second RV set in the case that the coding scheme is the turbo coding. The RV included in the RV set may be configured by the base station apparatus or terminal apparatus, or a certain RV set may be selected from multiple RV sets (e.g., the first RV set and the second RV set) by the base station apparatus or terminal apparatus. In this way, in the example in which four RVs to be used are selected from eight RVs, the base station apparatus or the terminal apparatus can transmit the control information including two bits indicating the redundancy version. In this case, the base station apparatus or the terminal apparatus can identify four RVs of eight RVs from two bits indicating the received redundancy version.

In the LDPC coding, rate matching performance by puncturing (bit selection) may not be good. For this reason, the LDPC coding can have (support) multiple mother coding rates. For example, the mother coding rate may be 1/3 or 1/2. FIG. 7 illustrates an operation example of the bit selection unit 503 in the case that the mother coding rate is 1/2. In the case that the LDPC coding has multiple mother coding rates, the bit selection patterns decrease, and thus, the number of RVs can be decreased. FIG. 8 illustrates a case that the mother coding rate is 1/3 and the number of RVs is two. FIG. 9 illustrates a case that the mother coding rate is 1/2 and the number of RVs is two. Switching between the mother coding rates 1/3 and 1/2 is performed based on the coding rate or the MCS. For example, in a case that the coding rate or the coding rate corresponding to the MCS is from 1/3 to 1/2, the mother coding rate can be 1/3. For example, in a case that the coding rate or the coding rate corresponding to the MCS exceeds 1/2, the mother coding rate can be 1/2.

The coding unit 2031 can switch the coding schemes depending on the transport block size or the information bit length. For example, the turbo coding can be performed in a case that the transport block size is smaller, and the LDPC coding can be performed in a case that the transport block size is larger. The terminal apparatus can indicate or transmit the transport block size or information bit length as a threshold thereof to the terminal apparatus. The terminal apparatus can use the threshold indicated or transmitted by the base station apparatus to determine the coding scheme.

The coding unit 2031 can switch the coding schemes depending on a system bandwidth. The LDPC coding is higher in the performance as a code word length is longer. Therefore, for example, the coding unit 2031 can perform the turbo coding in the case that the system bandwidth is narrower than 20 MHz, and can perform the LDPC coding in the case that the system bandwidth is wider than 20 MHz. At this time, the base station apparatus can perform decoding with the turbo code in the case that the system bandwidth is narrower than 20 MHz, and can perform decoding with the LDPC code in the case that the system bandwidth is wider than 20 MHz. The coding unit 2031 can switch the coding schemes depending on a carrier frequency. For example, the coding unit 2031 can perform the turbo coding in the case that the carrier frequency is 6 GHz or less, and can perform the LDPC coding in the case that the carrier frequency is 6 GHz or more. At this time, the base station apparatus can perform decoding with the turbo code in the case that the carrier frequency is 6 GHz or less, and can perform decoding with the LDPC code in the case that the carrier frequency is 6 GHz or more.

The terminal apparatus can transmit a transmit signal with a subcarrier spacing being varied. In this case, the coding unit 2031 can switch the coding schemes depending on the subcarrier spacing. For example, the coding unit 2031 can perform the turbo coding in the case that the subcarrier spacing is 15 KHz, and can perform the LDPC coding in the case that the subcarrier spacing is wider than 15 KHz. At this time, the base station apparatus can perform decoding with the turbo code in the case that the subcarrier spacing is 15 KHz, and can perform decoding with the LDPC code in the case that the subcarrier spacing is wider than 15 KHz.

The coding unit 2031 can switch the coding schemes for each cell. For example, the coding unit 2031 can perform the turbo coding in the PCell, and can perform the turbo coding and/or LDPC coding in the PSCell/SCell.

The modulation unit 2032 modulates coded bits input from the coding unit 2031, in compliance with the modulation scheme notified with the downlink control information, such as BPSK, QPSK, 16QAM, or 64QAM, or in compliance with a modulation scheme prescribed in advance for each channel.

The uplink reference signal generation unit 2033 generates a sequence acquired according to a rule (formula) prescribed in advance, based on a physical cell identity (PCI, also referred to as a Cell ID or the like) for identifying the base station apparatus 1A, a bandwidth to which the uplink reference signal is mapped, a cyclic shift notified with the uplink grant, a parameter value for generation of a DMRS sequence, and the like.

In accordance with the control signal input from the controller 202, the multiplexing unit 2034 rearranges modulation symbols of the PUSCH in parallel and then performs Discrete Fourier Transform (DFT) on the rearranged modulation symbols. Furthermore, the multiplexing unit 2034 multiplexes PUCCH and PUSCH signals and the generated uplink reference signal for each transmit antenna port. To be more specific, the multiplexing unit 2034 maps the PUCCH and PUSCH signals and the generated uplink reference signal to the resource elements for each transmit antenna port.

The radio transmitting unit 2035 performs Inverse Fast Fourier Transform (IFFT) on a signal resulting from the multiplexing, performs the modulation of SC-FDMA scheme, generates an SC-FDMA symbol, attaches CP to the generated SC-FDMA symbol, generates a baseband digital signal, converts the baseband digital signal into an analog signal, removes unnecessary frequency components, up-converts a result of the removal into a signal of a carrier frequency, performs power amplification, and outputs a final result to the transmit and receive antenna 206 for transmission.

The terminal apparatus 2 can perform not only the modulation of SC-FDMA scheme, but also modulation of OFDMA scheme.

A program running on an apparatus according to the present invention may serve as a program that controls a Central Processing Unit (CPU) and the like to cause a computer to operate in such a manner as to realize the functions of the embodiment according to the present invention. Programs or the information handled by the programs are temporarily stored in a volatile memory such as a Random Access Memory (RAM), or in a non-volatile memory such as a flash memory, or in a Hard Disk Drive (HDD) or other storage device systems.

The program for implementing the functions according the embodiment of the present invention may be recorded on a computer-readable recording medium. The functions may be implemented by causing a computer system to read the program recorded on this recording medium for execution. Note that the "computer system" refers to a computer system built into the apparatuses, and the computer system includes an operating system and hardware components such as a peripheral device. The "computer-readable recording medium" may include a semiconductor recording medium, an optical recording medium, a magnetic recording medium, a medium dynamically holding a program for a short time, or other computer-readable recording media.

The respective functional blocks or features of the apparatuses used in the above-described embodiments may be installed or performed by an electrical circuit, for example, an integrated circuit or multiple integrated circuits. An electric circuit designed to perform the functions described in the present specification may include a general-purpose processor, a Digital Signal Processor (DSP), an Application Specific Integrated Circuit (ASIC), a Field Programmable Gate Array (FPGA), or other programmable logic devices, discrete gates or transistor logic, discrete hardware components, or a combination thereof. The general-purpose processor may be a microprocessor, a processor of known type, a controller, a micro-controller, or a state machine. The electrical circuit described above may be constituted by a digital circuit, or an analog circuit. Furthermore, in a case that due to advances in semiconductor technology, a circuit integration technology that replaces the current integrated circuit is developed, one or more aspects according to the present invention can also use a new integrated circuit based on the relevant technology.

Note that the invention of the present patent application is not limited to the above-described embodiments. In the embodiment, apparatuses have been described as an example, but the invention of the present patent application is not limited to these apparatuses, and is applicable to a terminal apparatus or a communication apparatus of a fixed-type or a stationary-type electronic apparatus installed indoors or outdoors, for example, an AV apparatus, a kitchen apparatus, a cleaning or washing machine, an air-conditioning apparatus, office equipment, a vending machine, and other household apparatuses.

The embodiments of the present invention have been described in detail above referring to the drawings, but the specific configuration is not limited to the embodiments and includes, for example, an amendment to a design that falls within the scope that does not depart from the gist of the present invention. Furthermore, various modifications are possible within the scope of the present invention defined by claims, and embodiments that are made by suitably combining technical means disclosed according to the different embodiments are also included in the technical scope of the present invention. Furthermore, a configuration in which constituent elements, described in the respective embodiments and having mutually the same effects, are substituted for one another is also included in the technical scope of the present invention.

INDUSTRIAL APPLICABILITY

The present invention can be preferably used in a base station apparatus, a terminal apparatus, and a communication method.

The present international application claims priority based on JP 2016-148113 filed on Jul. 28, 2016, and all the contents of JP 2016-148113 are incorporated in the present international application by reference.

REFERENCE SIGNS LIST

1A Base station apparatus
2A, 2B Terminal apparatus
101 Higher layer processing unit
102 Controller
103 Transmitter
104 Receiver
105 Transmit and receive antenna
1011 Radio resource control unit
1012 Scheduling unit
1031 Coding unit
1032 Modulation unit
1033 Downlink reference signal generation unit
1034 Multiplexing unit
1035 Radio transmitting unit
1041 Radio receiving unit
1042 Demultiplexing unit
1043 Demodulation unit
1044 Decoding unit
201 Higher layer processing unit
202 Controller
203 Transmitter
204 Receiver
205 Channel state information generating unit
206 Transmit and receive antenna
2011 Radio resource control unit
2012 Scheduling information interpretation unit
2031 Coding unit
2032 Modulation unit
2033 Uplink reference signal generation unit
2034 Multiplexing unit
2035 Radio receiving unit
2041 Radio receiving unit
2042 Demultiplexing unit
2043 Signal detection unit
301 Turbo coding unit
302-1, 302-2, 302-3, 502 Interleaving unit
303, 503 Bit selection unit
501 LDPC coding unit

The invention claimed is:

1. A communication apparatus comprising turbo coding circuitry, interleaving circuitry, first hit selection circuitry, tow-density parity check (LDPC) coding circuitry, and second bit selection circuitry, wherein:
the turbo coding circuitry is configured to produce a first bit sequence at a first coding ratio by taking a transmission bit sequence as input and using a turbo coding, the interleaving circuitry is configured to produce an interleaved bit sequence by interleaving the first bit sequence, the first bit selection circuitry is configured to produce a first encoded bit sequence by selecting a first predetermined number of bits of the interleaved hit sequence from a first initial location, the first initial location being determined based on a first redundancy version,
the LDPC coding circuitry is configured to produce a second bit sequence at a second coding ratio by taking the transmission bit sequence as input and using an LDPC coding, the second bit selection circuitry is configured to produce a second encoded bit sequence by selecting a second predetermined number of bits of the second bit sequence from a second initial location, the second initial location being determined based on a second redundancy version,
the first redundancy version is one of four, different redundancy versions, and the second redundancy version is one of the four, different redundancy versions,
in a case that the first redundancy version is equal to 0, the first initial location is in the first location among locations for the four, different redundancy versions, and the first bit selection circuitry selects the first predetermined number of bits of the interleaved bit sequence from a hit other than a first bit of the interleaved bit sequence, and in a case that the second redundancy version is equal to 0, the second initial location is in the first location among locations for the four, different redundancy versions and the second bit selection circuitry selects the second predetermined number of bits of the second bit sequence from a first bit of the second bit sequence.

2. The communication apparatus according to claim 1, wherein
the first coding ratio takes a first ratio and the second coding ratio takes one of a plurality of second ratios.

3. The communication apparatus according to claim 1, wherein
in a case that a master cell group (MCG) and a secondary cell group (SCG) are configured, the turbo coding circuitry is configured to produce the first bit sequence, the first interleaving circuitry is configured to produce the interleaved bit sequence, the first bit selection circuitry is configured to produce the first encoded bit sequence in the MCG, the LDPC circuitry is configured to produce the second bit sequence, and the second bit selection circuitry is configured to produce the second encoded bit in the SCG, wherein the MCG and the SCG are used for a dual connectivity.

* * * * *